United States Patent [19]
Dominic

[11] Patent Number: 5,972,735
[45] Date of Patent: Oct. 26, 1999

[54] METHOD OF PREPARING AN ELECTRONIC PACKAGE BY CO-CURING ADHESIVE AND ENCAPSULANT

[75] Inventor: Christopher J. Dominic, Westminster, Calif.

[73] Assignee: National Starch and Chemical Investment Holding Corporation, Wilmington, Del.

[21] Appl. No.: 09/115,064

[22] Filed: Jul. 14, 1998

[51] Int. Cl.$^6$ .......................... H01L 21/44; H01L 21/48; H01L 21/50; G01R 31/26

[52] U.S. Cl. .......................... 438/118; 438/127; 438/119; 438/15

[58] Field of Search ...................................... 438/118, 127, 438/119, 15, 106

[56] References Cited

U.S. PATENT DOCUMENTS 5,837,558 11/1998 Zuniga et al. ............................. 438/15

*Primary Examiner*—John F. Niebling
*Assistant Examiner*—Neal Berezny
*Attorney, Agent, or Firm*—Jane E. Gennaro

[57] ABSTRACT

A semi-conductor package in which an integrated circuit chip is connected to a substrate using wire-bonding is prepared by curing the die attach adhesive and encapsulating the wire bonds in one heating step. The encapsulant composition has a curing chemistry and a curing profile compatible with those of the adhesive.

6 Claims, No Drawings

METHOD OF PREPARING AN ELECTRONIC PACKAGE BY CO-CURING ADHESIVE AND ENCAPSULANT

FIELD OF THE INVENTION

This invention relates to a method for preparing an electronic package, and more specifically to a method for preparing a semiconductor chip on a substrate.

BACKGROUND OF THE INVENTION

Electronic devices contain numerous electrical circuit components, mainly transistors assembled in integrated circuit (IC) chips. Integrated circuit chips are mechanically and electrically supported on a substrate with either the active face (the surface containing the circuit elements) or the passive face confronting the substrate. This connection between the chip and its supporting substrate is referred to as first level chip interconnection.

A common method of first level chip interconnection is wire-bonding. The chip first is adhered to its substrate with an adhesive, typically in paste or film (tape) form. Depending on specific design parameters, either the active or passive face of the chip is adhered to either the active or passive face of the substrate. The active surface of the substrate carries a pattern of electrical terminals and usually electrical circuitry; however, the circuitry may be on the opposite surface of the substrate from the terminals. For the purpose of this specification, the active surface of the substrate refers to the side carrying the electrical terminals.

The substrate used in wire bonding can be either a rigid substrate, such as a metal leadframe, ceramic substrate, laminate, or it can be a flexible substrate, such as a polyimide flexible circuit.

The assembly is subjected to heat to soften the adhesive, the chip is contacted with the adhesive using light pressure, and then the assembly is put in an oven with a curing atmosphere of dry nitrogen to cure the adhesive. Typical curing schedules for epoxies are one hour at 150° C.; typical curing schedules for polyimides are 30 minutes at 150° C., followed by 30 minutes at 275° C.

The active terminals on the surface of the chip are then connected to the active terminals on the surface of the substrate with a fine metal wire or ribbon in an automated operation known as wire-bonding.

The surface area of the applied adhesive may be smaller than the surface area of the chip in the case where the active side of the chip is attached to the substrate. This creates a gap between the substrate and the chip. After wire-bonding, this gap is filled with encapsulant by capillary action, and the encapsulant then cured. Alternatively, where the passive side of the chip is attached to the substrate, the encapsulant is used to cover the exposed active surface of the chip and the wire bonds connecting the electrical terminals of the chip with those on the substrate. Cure temperatures and times for the encapsulant typically range from 100° C. to 175° C. for one/half to two hours.

The encapsulated chip and substrate form what is known as a single-chip module or assembly. Other assemblies may contain multiple chips in a discrete package. For multi-chip packages, the procedure is the same for each individual chip. These packages, either the chip scale package or the multi-chip package, are in turn supported on a larger substrate, such as a printed circuit board, and interconnected with other electrical components. The interconnection between these discrete assemblies and the larger substrate is referred to as second level interconnection.

Alternatively, a bare IC chip can be directly attached to the printed circuit board in an assembly known as chip-on-board. Currently, the most widely used method for chip-on-board assembly is the wire-bonding method just described. However, the encapsulant is applied not just to the area under the chip, but also over the whole chip so as to protect it from environmental damage.

In addition to cost of materials, one of the major concerns in the semi-conductor industry is speed of manufacture, which itself translates into cost. If a process can be done faster with no loss in performance properties of the final assembly, the advantage would be an improvement welcomed by the industry.

SUMMARY OF THE INVENTION

This invention is a process for preparing a semi-conductor package in which an integrated circuit chip is connected to a substrate using wire-bonding.

The process comprises the sequential steps of (a) providing an integrated circuit chip with electrical terminals for connection to a substrate, (b) providing a substrate for the integrated circuit chip having electrical terminals for interconnection to the terminals on the chip, (c) disposing an adhesive having adequate green strength on either face of the substrate or (d) disposing an adhesive having adequate green strength on either face of the chip, such that in either step (c) or step (d) the surface area of the disposed adhesive resides on an area of the chip or substrate devoid of active components or terminals, (e) contacting the chip and the substrate together with sufficient pressure and heat so that the adhesive adheres the chip to the substrate, which may result in a gap between the chip and the substrate where no adhesive is present, (f) wire-bonding the chip to the substrate, (g) providing an encapsulant composition that has a curing chemistry and a curing profile compatible with the adhesive, (h) disposing the encapsulant along the periphery of the chip so that the encapsulant fills any gap formed in step (e), (i) subjecting the resultant assembly to a sufficient temperature for a sufficient time to cure the adhesive and the encapsulant simultaneously.

DETAILED DESCRIPTION OF THE INVENTION

For purposes of this specification, the term "green strength" refers to the strength property of the adhesive after a brief process to attach the chip to the substrate and before the adhesive has been subjected to its normal cure condition. Adequate green strength is that adhesion strength that is effective to prevent chip movement during wire-bonding. As is understood by those skilled in the art, the wire-bonding process is automated and a small amount of movement may be tolerated. Movement for purposes of this specification means any movement that interferes with the registration of an automated wire-bonding process.

The main advantage of the process of this invention is that the adhesive and the encapsulant can be co-cured, saving valuable process time. In order for the curing to be effective for both the adhesive and the encapsulant, the curing mechanisms and curing profiles must be compatible. For example: if the adhesive is an epoxy with an amine curing agent, the encapsulant should not be one that cures with a Pt catalyst, since the amine would poison the Pt and make it ineffective; the encapsulant or the adhesive should not be of chemistry that needs to be cured at temperatures that would embrittle or weaken the other. Therefore, for purposes of this specification, compatible means that the curing conditions and curing chemistry for the adhesive and the encapsulant must not interfere with or impair the performance of the other.

The substrates for the integrated circuit chips can be any rigid or flexible substrate used in the manufacture of semiconductor packages. The most prominently used substrates include flexible tapes or sheets with circuitry of a conductive metal such as gold or copper and based on a polyimide film material such as Upilex manufactured by Ube Corporation in Japan or Kapton manufactured by DuPont. Such flexible circuit materials may be obtained from Hitachi Cable. Other commonly used substrates include bismaleimide triazine substrates; epoxy/glass fiber laminates, such as FR4 board; metal lead frames, such as nickel-iron alloys, copper coated composites and ceramic substrates. All these materials are well known and used in the industry.

The adhesive can be any die attach adhesive that has all the industry required properties for die attach, and that has adequate green strength. The composition of the adhesive preferably is predominantly an elastomer, such as a butadiene acrylonitrile rubber, and includes epoxy resin and curing agents, such as amines, commonly used to cure epoxy resins.

The adhesive may be in paste or film (tape) form, but preferably is a film. A suitable film adhesive can be prepared by coating both sides of a carrier, such as a film sold by DuPont under the trademark Kapton, or one sold by Ube Corporation in Japan under the trademark Upilex, with a suitable adhesive composition; alternatively, the adhesive film can be unsupported. A suitable adhesive film is that available from Ablestik Laboratories, Rancho Dominguez, Calif., under product number 5201.

The substrate contains electrical terminals to which electrical terminals on the chip are connected. In most operations, the adhesive is applied to the substrate, and will be applied in an area deliberately left void of terminals in order to accept the circuit chip. The adhesive is applied in an amount and geometry so that it will contact a portion or portions of the chip that are free of electrical terminals.

The substrate may be heated, and if it is, it may be heated either before or after the deposition of the adhesive. Typical temperatures are in the range of 50° C. to 120° C. If the adhesive is in film form, light pressure may also be applied. The application of heat and pressure helps to soften the adhesive and make it more conducive to receiving the chip.

The chip can be placed on the adhesive with either the active or the passive face confronting the adhesive. If the active face is disposed toward the adhesive, a section of the active face will be void of electrical terminals for making contact with the adhesive. The chip is deposited onto the adhesive and may be deposited with pressure, usually in the range of 200 g to 2000 g, and with a light side-to-side motion to help adherence. The chip may also be heated before it is deposited on the adhesive pad.

After the chip is in place on the adhesive, it undergoes the wire-bonding operation to connect the terminals of the chip to the terminals of the substrate. Any of the methods known in the industry to accomplish the wire-bonding may be used. In the present invention, curing of the adhesive is not needed before wire-bonding. Due to the strong green strength of the adhesive, the chip is secured to the substrate with sufficient adhesion and remains stable during wire-bonding.

It will be understood that as the adhesive is only disposed in the portion or portions of the chip that do not contain electrical terminals, gaps between the chip and the substrate will result in the areas under the chip that are free of the adhesive. After wire-bonding, any gaps between the chip and the substrate are filled with an encapsulant composition, usually by disposing the encapsulant along the periphery of the chip and allowing capillary action to draw the encapsulant inward.

The encapsulant composition may be any encapsulant composition that has the required industrial properties for encapsulant, and that is compatible in curing conditions and chemistry with the adhesive composition. For adhesive compositions that are epoxy based, the preferred encapsulant is a thermosetting epoxy composition, using an amine curing agent. The encapsulant may be a liquid or a solid at room temperature, provided it has a sufficiently low viscosity at application temperatures to be drawn into any gap between the chip and the substrate. Typical injection or application temperatures for room temperature-solid epoxy encapsulants are about 150° C. Suitable encapsulants that are solids at room temperature are epoxy molding compounds, such as those sold by Sumitomo, Amoco and Nitto Denko. A suitable liquid encapsulant is that available from Ablestik Laboratories under product number 7850, and this may be applied at 25° C. to 100° C.

After the encapsulant is applied, the assembly is introduced to a heating cycle to cure the adhesive and the encapsulant simultaneously. Preferably, the curing temperatures for both adhesive and encapsulant compositions will be in the same general temperature range so that cure is effected for both simultaneously. The exact curing cycle will be dependent on the nature of the adhesive and encapsulant compositions, but in general, the curing temperature will be in the range of 100° C. to 180° C. for a period of time effective to cure the compositions. The resultant assembly is referred to in this specification and the claims as a semiconductor package.

EXAMPLE

To test JEDEC reliability of semi-conductor packages prepared by the method of this invention, a series of six flexible substrate strips having 30 silicon chips attached on each were prepared so that the active face of the dies confronted the active face of the substrate.

The substrates were Upilex polyimide flexible circuit tape strips (sold by Hitachi Cable) having an active surface of gold circuitry. A trilayer adhesive film (adhesive coated on both surfaces of a polyimide carrier) available from Ablestik Laboratories as product number 7850 was laminated to the substrate at 105° C. All the substrates reported in the table to follow, except for substrates #3 and #14, were pre-dried prior to die attach. Then the 30 silicon dies were attached periodically along each of the substrate strips. The dies were first heated to 170° C. and attached by pressing lightly into the adhesive for about one second.

Wire bonding was performed on substrate #3 only. The entire substrate was preheated to 150° C. for two minutes and then removed to the wire-bonding stage where the dies were heated to 185° C. and wire-bonded. This process took about 45 seconds.

Prior to encapsulation, the adhesive on substrates 10, 11 and 14 were cured at 150° C. for 40 minutes. Each substrate was encapsulated on a heated stage set at 80° C. The encapsulant is one available from Ablestik Laboratories under product numbers in the 7850 series. The encapsulant, and the encapsulant plus adhesive for those substrates that were not previously cured, were partially cured at 100° C. for 30 minutes, and afterwards at 150° C. for an additional 30 minutes.

Each substrate was singulated and the packages subjected to JEDEC level 1, 2 and 3 conditions, subjected to simulated solder reflow and then examined for delamination. JEDEC level 1 testing constitutes subjecting the package to 85° C. at 85% relative humidity for seven days. JEDEC level 2 testing constitutes subjecting the package to 85° C. at 60% relative humidity for seven days. JEDEC level 3 testing constitutes subjecting the package to 30° C. at 60% relative humidity for eight days. Simulated solder reflow was performed in an IR tunnel oven using the profile: ambient to 220° C. within 3 minutes, >220° C. peaking at 240° C. for 1.5 minutes.

The results are reported in the following table. Co-cure means that the adhesive and encapsulant were cured simultaneously; indepen. means that the adhesive and encapsulant were cured in independent steps as described. JEDEC 1, 2 or 3 pass means that the packages did not delaminate after simulated solder reflow after the respective humidity. The denominator of the numbers in ratio format indicate the total packages tested, and the numerator, those that passed the JEDEC conditions.

The data show that the co-cure process for substrates 3, 12, and 13 show JEDEC level 1, 2 and 3 performance at least as good as the process in which the adhesive and encapsulant are cured independently. Consequently, the inventive co-cure process eliminates one step in this method of preparing a semi-conductor package, saving time and energy, and resulting in a package that shows no deterioration in moisture resistance performance.

| Sub-strate | Cure Profile | Pre-dry | JEDEC 1 Pass | JEDEC 2 Pass | JEDEC 3 Pass | % Total Pass |
|---|---|---|---|---|---|---|
| 3 | co-cure | no | 9/9 | 13/13 | 10/12 | 94 |
| 10 | indepen. | yes | NT | 3/13 | 9/13 | 44 |
| 11 | indepen. | yes | 4/9 | 10/13 | 11/13 | 71 |
| 13 | co-cure | yes | 6/12 | 12/13 | 12/13 | 62.5 |
| 14 | indepen. | no | NT | 9/12 | 6/13 | 40 |

NT = Not tested

What is claimed is:

1. A process for preparing a semi-conductor package in which an integrated circuit chip is connected to a substrate having electrical terminals for connection to the chip, the process comprising the sequential steps of (a) providing an integrated circuit chip with electrical terminations for connection to the substrate, (b) disposing an elastomeric adhesive on either face of the substrate, the adhesive having green strength effective to prevent chip movement during wire-bonding or (c) disposing such adhesive on either face of the chip, such that in step (b) or step (c) the surface area of the disposed adhesive resides on an area of the chip or substrate devoid of terminals, (d) contacting the chip and the substrate together with sufficient pressure and heat so that the adhesive adheres the chip to the substrate, which may result in a gap between the chip and the substrate where no adhesive is present, (e) wire-bonding the chip to the substrate, (f) providing an encapsulant composition that has a curing chemistry and a curing profile compatible with the adhesive, (g) disposing the encapsulant along the periphery of the chip so that the encapsulant fills any gaps formed in step (d) forming a semi-conductor package, (h) subjecting the semi-conductor package to a cure temperature for a cure time sufficient to cure the adhesive and the encapsulant simultaneously.

2. The process according to claim 1 in which the substrate is selected from the group consisting of flexible circuit tapes or sheets, bismaleimide triazine substrates, epoxy/glass fiber laminates, metal lead frames, and ceramic substrates.

3. The process according to claim 1 in which the adhesive in step (b) is a film adhesive.

4. The process according to claim 3 in which the film adhesive comprises an elastomer, an epoxy resin and curing agent for the epoxy.

5. The process according to claim 4 in which the encapsulant composition in steps (f), (g), and (h) is a thermosetting epoxy containing an amine curing agent.

6. The process according to claim 1 in which the cure temperature in step (h) is in the range of 100° C. to 180° C., for a period of time in the range of one/half hour to two hours.

* * * * *